(12) United States Patent
Brunnbauer et al.

(10) Patent No.: US 10,373,871 B2
(45) Date of Patent: Aug. 6, 2019

(54) METHOD OF SEPARATING SEMICONDUCTOR DIES FROM A SEMICONDUCTOR SUBSTRATE, SEMICONDUCTOR SUBSTRATE ASSEMBLY AND SEMICONDUCTOR DIE ASSEMBLY

(71) Applicant: Infineon Technologies AG, Neubiberg (DE)

(72) Inventors: Markus Brunnbauer, Lappersdorf (DE); Franco Mariani, Pentling-Neudorf (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/968,312

(22) Filed: May 1, 2018

(65) Prior Publication Data

US 2018/0247872 A1 Aug. 30, 2018

Related U.S. Application Data

(62) Division of application No. 15/596,938, filed on May 16, 2017, now Pat. No. 9,972,535.

(30) Foreign Application Priority Data

May 25, 2016 (DE) .................. 10 2016 109 693

(51) Int. Cl.
| | |
|---|---|
| *H01L 21/78* | (2006.01) |
| *H01L 21/304* | (2006.01) |
| *H01L 21/306* | (2006.01) |
| *H01L 21/308* | (2006.01) |

(Continued)

(52) U.S. Cl.
CPC ............ *H01L 21/78* (2013.01); *H01L 21/304* (2013.01); *H01L 21/308* (2013.01); *H01L 21/3083* (2013.01); *H01L 21/30604* (2013.01); *H01L 21/6835* (2013.01); *H01L 21/6836* (2013.01); *H01L 23/544* (2013.01); *H01L 2221/6834* (2013.01); *H01L 2221/68318* (2013.01); *H01L 2221/68327* (2013.01); *H01L 2223/5442* (2013.01)

(58) Field of Classification Search
CPC .............................. H01L 21/78; H01L 21/304
See application file for complete search history.

(56) References Cited

U.S. PATENT DOCUMENTS

| | | | |
|---|---|---|---|
| 6,245,646 B1 | 6/2001 | Roberts | |
| 6,399,464 B1 * | 6/2002 | Muntifering | .......... H01L 21/304 |
| | | | 257/E21.237 |

(Continued)

*Primary Examiner* — George R Fourson, III
(74) *Attorney, Agent, or Firm* — Slater Matsil, LLP

(57) ABSTRACT

Separation grooves are etched from a main surface into a semiconductor substrate. The separation grooves separate chip regions in horizontal directions parallel to the main surface. At least some of the separation grooves are spaced from a lateral outer surface of the semiconductor substrate by at most a first distance. An indentation is formed along a lateral surface. The indentation extends from the main surface into the semiconductor substrate. A minimum horizontal indentation width of the indentation is equal to or greater than the first distance. A with respect to the main surface vertical extension of the indentation is equal to or greater than a vertical extension of the separation grooves.

20 Claims, 13 Drawing Sheets

(51) Int. Cl.
*H01L 21/683* (2006.01)
*H01L 23/544* (2006.01)

(56) References Cited

U.S. PATENT DOCUMENTS

| | | | | |
|---|---|---|---|---|
| 7,709,932 | B2* | 5/2010 | Nemoto | H01L 21/6835 257/618 |
| 9,865,468 | B2* | 1/2018 | Ono | H01L 21/6836 |
| 2003/0235937 | A1* | 12/2003 | Mong | H01L 21/6835 438/106 |
| 2005/0006725 | A1 | 1/2005 | Kurosawa et al. | |
| 2008/0315434 | A1* | 12/2008 | McElrea | H01L 21/6835 257/777 |
| 2011/0312157 | A1* | 12/2011 | Lei | H01L 21/78 438/462 |
| 2013/0149842 | A1* | 6/2013 | Senzai | B32B 3/30 438/465 |
| 2013/0178006 | A1* | 7/2013 | Kim | H01L 21/78 438/33 |
| 2013/0264691 | A1* | 10/2013 | Kamphuis | H01L 21/4814 257/659 |
| 2014/0017880 | A1 | 1/2014 | Lei et al. | |
| 2015/0221554 | A1* | 8/2015 | Kosaka | H01L 21/78 438/462 |
| 2015/0235900 | A1 | 8/2015 | Bieck et al. | |
| 2015/0332911 | A1 | 11/2015 | Priewasser | |
| 2015/0357251 | A1 | 12/2015 | Usami | |
| 2016/0086852 | A1* | 3/2016 | Holden | H01L 21/78 438/462 |
| 2016/0104626 | A1* | 4/2016 | Nelson | H01L 23/3114 438/114 |
| 2016/0163579 | A1 | 6/2016 | Nakamura et al. | |
| 2016/0246170 | A1* | 8/2016 | Bowen | G03F 7/0002 |
| 2017/0025471 | A1* | 1/2017 | Bhushan | H01L 43/12 |
| 2017/0076969 | A1 | 3/2017 | Shirono et al. | |
| 2017/0140974 | A1* | 5/2017 | Kimura | B32B 7/12 |

* cited by examiner

METHOD OF SEPARATING SEMICONDUCTOR DIES FROM A SEMICONDUCTOR SUBSTRATE, SEMICONDUCTOR SUBSTRATE ASSEMBLY AND SEMICONDUCTOR DIE ASSEMBLY

CROSS-REFERENCE TO RELATED APPLICATIONS

This application is a divisional of U.S. patent application Ser. No. 15/596,938, filed May 16, 2017, which application claims the benefit of DE Application No. 102016109693.8, filed on May 25, 2016, which applications are hereby incorporated herein by reference.

TECHNICAL FIELD

The present invention relates generally to semiconductor devices, and, in particular embodiments, to methods of separating semiconductor dies from a semiconductor substrate, semiconductor substrate assembly and semiconductor die assembly.

BACKGROUND

Die singulation denotes a process of isolating individual semiconductor chips or semiconductor dies from a semiconductor wafer. A dicing process accomplished by scribing and breaking, e.g., by mechanical sawing or laser cutting separates the semiconductor dies along kerf lines. After dicing, individual semiconductor chips are typically mounted onto chip carriers and/or encapsulated in chip housings. DBG (dice before grind) firstly incompletely dices a wafer by using a half-cut dicer that forms dicing streets between chip regions on a wafer front side. A depth of the dicing streets is equal to or greater than a final target thickness of the semiconductor chips. A stiff carrier member fixed to the diced surface stabilizes the half-diced wafer during a grinding process that thins the wafer from the undiced surface to the final target thickness. The grinding process exposes the dicing streets and completes separation of the semiconductor chips. A flexible pick-up tape is attached onto the side of the semiconductor chips opposite to the grinding tape, the latter being removed in the following. The pick-up tape may hold the separated semiconductor chips in place until a handling apparatus or operator picks up the semiconductor chips for further processing, e.g., for packaging or placement.

There is a need to improve the yield of processes for die singulation such as DBG.

SUMMARY

According to an embodiment, a method of manufacturing semiconductor devices includes etching separation grooves from a main surface into a semiconductor substrate. The separation grooves separate chip regions in horizontal directions parallel to the main surface. A distance between at least some of the separation grooves and the lateral outer surface is at most a first distance. An indentation is formed that extends along a lateral outer surface from the main surface into the semiconductor substrate. A minimum horizontal indentation width is equal to or greater than the first distance and a with respect to the main surface vertical extension of the indentation is equal to or greater than a vertical extension of the separation grooves.

According to another embodiment, a semiconductor substrate assembly includes a semiconductor substrate that includes chip regions horizontally separated by equally-spaced, parallel first separation grooves and by equally-spaced, parallel second separation grooves extending from a main surface into the semiconductor substrate, wherein the second separation grooves orthogonally intersect the first separation grooves. At least some of the separation grooves are spaced from a lateral outer surface of the semiconductor substrate by at most a first distance. Along an edge, which the main surface forms with the lateral surface, an indentation extends from the main surface into the semiconductor substrate. A with respect to the main surface vertical extension of the indentation is equal to or greater than a vertical extension of the separation grooves and a minimum horizontal indentation width is equal to or greater than the first distance.

According to a further embodiment a semiconductor die assembly includes a plurality of semiconductor dies, which are separated in two orthogonal horizontal directions by equally-spaced separation trenches, respectively. The semiconductor dies are arranged within a circle with a first radius around a center axis of the semiconductor die assembly. The first radius is smaller than a wafer standard radius by an indentation width of at least 1 mm and at most 5 mm. The semiconductor die assembly further includes at least one of a stiff carrier member and a flexible pick-up tape. The carrier member is adhered onto first surfaces at a front side of the semiconductor dies through a radiation or thermal release adhesive film. The flexible pick-up tape is adhered onto second surfaces on the back of the semiconductor dies through a radiation or thermal release adhesive film.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION OF ILLUSTRATIVE EMBODIMENTS

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" include the plural as well as the singular, unless the context clearly indicates otherwise.

FIGS. 1A to 7 concern a method of separating semiconductor chips from a semiconductor substrate by a DBG method based on an etch process for pre-dicing, wherein initially terminated separation grooves are later horizontally opened at the end faces by an indentation formed along a lateral surface of the semiconductor substrate.

A photoresist layer is deposited on a main surface 101 at a front side of a semiconductor substrate 100. An EBR (edge bead removal) process may remove a portion of the deposited photoresist in a circumferential strap along the edge of the main surface 101. The remaining portion of the photoresist layer is partially exposed and developed to form an etch mask 400.

Figure 1A:
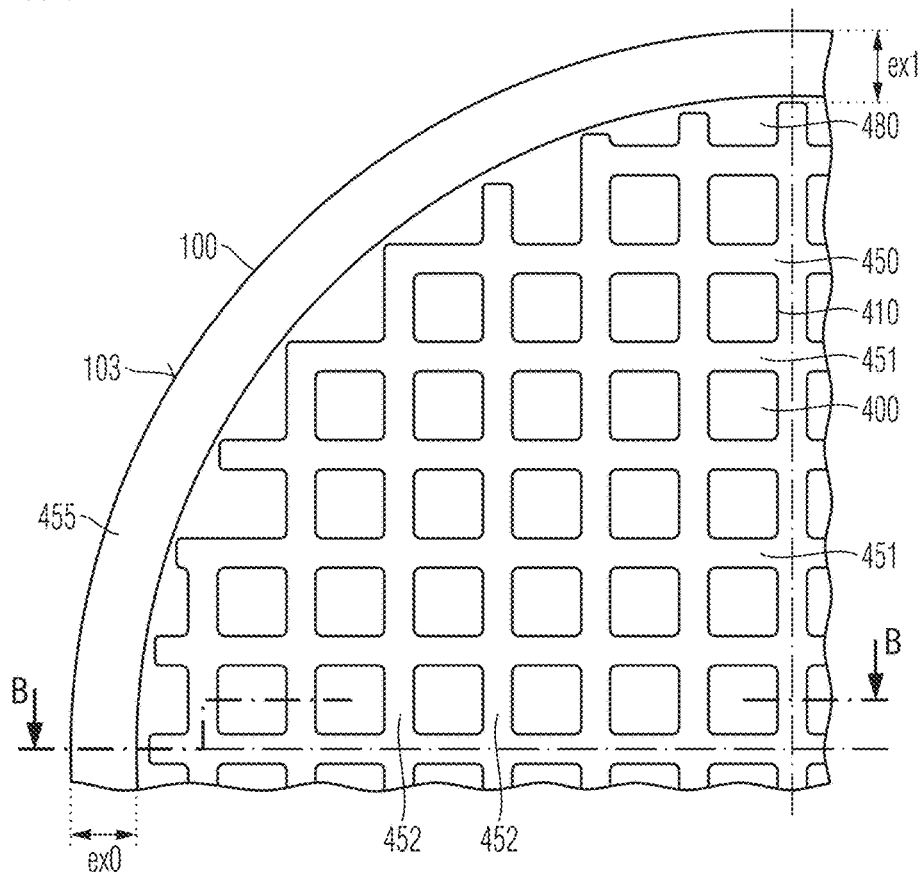
FIG. 1A is a schematic top view of a portion of a semiconductor substrate for illustrating a method for separating semiconductor dies from a semiconductor substrate by a "dice before grind" process according to an embodiment concerning terminated mask grooves and initially terminated separation grooves, after forming an etch mask.
Figure 1B:
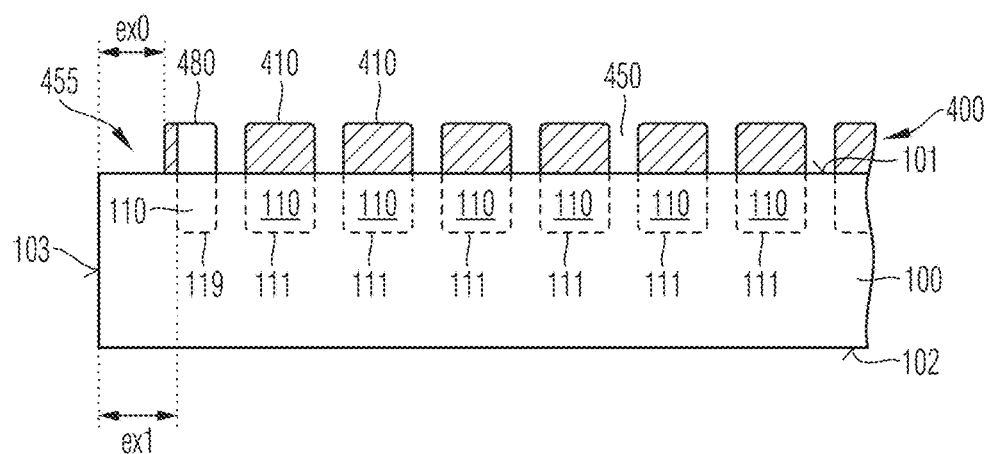
FIG. 1B is a schematic vertical cross-sectional view of the semiconductor substrate portion of FIG. 1A along line B-B.

FIGS. 1A and 1B show isolated mask portions 410 of the etch mask 400 on the main surface 101 of the semiconductor substrate 100.

The semiconductor substrate 100 may be a processed semiconductor wafer based on a crystalline semiconductor material such as crystalline silicon, germanium, silicon carbide or an $A_{III}B_V$ semiconductor. In addition to a layer of semiconductor material, the semiconductor substrate 100 may include a layer of insulating material, for example, silicon oxide, silicate glass, or a ceramic.

Shape and dimensions of the semiconductor substrate 100 are compatible with conventional production lines for semiconductor devices. The semiconductor substrate 100 may have an approximately cylindrical shape, wherein one of two parallel planar surfaces forms the main surface 101. The outer surface (lateral surface) 103 of the semiconductor substrate 100 may include a flat parallel to the cylinder axis, wherein the flat indicates a main crystal direction. The diameter of the semiconductor substrate 100 may be 50.8 mm (2 inch), 76.2 mm (3 inch), 100 mm ("4 inch"), 150 mm ("6 inch"), 200 mm ("8 inch" wafer), or 300 mm ("12 inch" wafer), by way of example. A thickness of the semiconductor substrate 100 may be between several 10 µm and 800 µm, by way of example.

A normal to the main surface 101 defines a vertical direction. Directions parallel to the main surface 101 are horizontal directions.

The semiconductor substrate 100 includes chip regions 110 arranged matrix-like in lines and rows and spaced from each other by idle substrate stripes. Each chip region 110 is formed along or close to the main surface 101 and includes a plurality of interconnected passive and active electronic components. The chip regions 110 may also include a metallization layer at the front side along the main surface 101. For example, the chip regions 110 correspond to the dies of microcontrollers for chip cards, e.g., mobile phone SIM cards, payment cards, or security chips.

The chip regions 110 include complete chip regions 111 corresponding to fully functional semiconductor chips as well as incomplete chip regions 119 at the end of lines and rows of chip regions 110. Due to the curvature of the semiconductor substrate 100 at the end of at least some of the lines and rows no complete semiconductor chips can be formed. Nevertheless, the incomplete chip regions 119 are subjected to the same processes as the complete chip regions 111.

The etch mask 400 includes a plurality of equally spaced mask portions 410. Straight mask trenches 450 separate the mask portions 410 from each other, wherein first parallel mask trenches 451 orthogonally intersect second parallel mask trenches 452. The first and second mask trenches 451 define a grid, wherein the mask portions 410 in the meshes of the grid are in the vertical projection of the chip regions 110.

In an edge exclusion strap 455 with an approximately uniform edge exclusion width ex0 the EBR exposes the main surface 101. A boundary mask portion 480 directly adjoins the edge exclusion strap 455 and surrounds the plurality of mask portions 410.

According to the illustrated embodiment, the boundary mask portion 480 terminates the mask trenches 450 at their end faces such that the mask trenches 450 are confined in all horizontal directions and the boundary mask portion 480 forms a closed, circumferential structure surrounded by the edge exclusion strap 455. The boundary mask portion 480 may completely cover the incomplete chip regions 119.

The shape of an outer edge of the boundary mask portion 480 mainly includes a segment of a circle and may include a straight line parallel to the wafer flat. The inner edge of the boundary mask portion 480 may be a stepped line of orthogonal line sections.

At least some of the mask trenches 450, i.e., a true subset of the mask trenches 450 have a distance to the lateral surface 103 that is not greater than a first distance ex1.

At least some or all of the mask trenches 450 may include stubs extending into to the boundary mask portion 480 such that at each end every mask trench 450 has a distance not greater than the first distance ex1 to the lateral surface 103.

According to another embodiment, the mask trenches 450 do not include stubs and the inner edge of the boundary mask portion 480 exclusively includes line portions parallel to and opposite of edges of the mask portions 410. In this case, only a true subset of the mask trenches 450 has a distance not greater than the first distance ex1 to the lateral surface 103.

According to further embodiments the mask trenches 450 may open out into a circumferential mask trench or into free space.

An etching process, e.g., a plasma etch such as RIE (reactive ion etching) uses the etch mask 400 to form separation grooves 150 between the chip regions 110. A ring-shaped ceramic frame may shield the complete edge exclusion strap 455 or at least a portion thereof against the etching reactants.

Figure 2A:
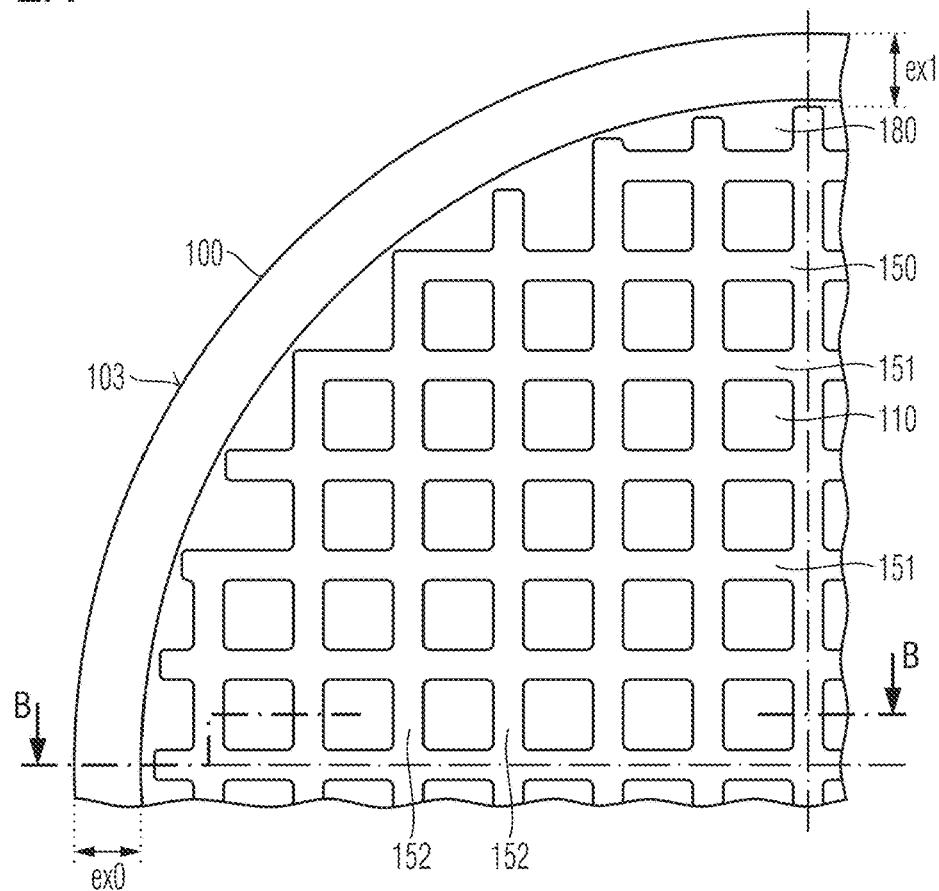
FIG. 2A is a schematic top view of the semiconductor substrate portion of FIG. 1A, after forming terminated separation grooves.
Figure 2B:
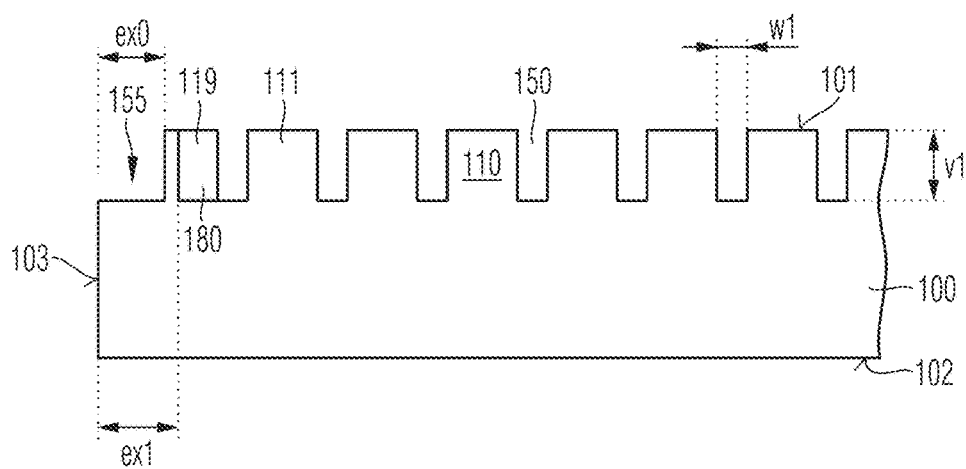
FIG. 2B is a schematic vertical cross-sectional view of the semiconductor substrate portion of FIG. 2A along line B-B.

FIGS. 2A and 2B show the separation grooves 150 extending from the main surface 101 into the semiconductor substrate 100. A horizontal width w1 of the separation grooves 150 may be in a range from 4 µm to 20 µm, for example in a range from 6 µm to 15 µm.

A vertical extension v1 of the separation grooves 150 may be equal to or greater than a final vertical extension of the finalized semiconductor chip and may be in a range from several ten micrometers to several hundred micrometers, e.g., in a range from 10 µm to 300 µm, e.g., up to 250 µm. The separation grooves 150 include equally spaced parallel first separation grooves 151 and equally spaced parallel second separation grooves 152 orthogonal to the first separation grooves 151 and intersecting the first separation grooves 151.

An edge groove 155 may extend along the edge of the main surface 101 to the lateral surface 103 provided that the etch process is effective at least to some degree in the area of the edge exclusion strap 455, e.g., if no ring-shaped ceramic frame is used. A vertical extension of the edge groove 155 may be smaller than, equal to or greater than the vertical extension v1 of the separation grooves 150. The use of a ring-shaped ceramic frame may suppress formation of the edge groove 155.

A distance of the end faces of the separation grooves 150 to the lateral surface 103 of the semiconductor substrate 100 is not greater than the first distance ex1, which may be greater than the edge exclusion width ex0.

Compared to mechanical processes for forming the separation grooves 150, for example, by using a sawing blade the etch process allows for narrower separation grooves 150. Narrower separation grooves 150 allow for increasing the number of chip regions 110 per semiconductor substrate 100. Sidewalls of the exposed chip regions 110 are only to a low degree prone to the formation of cracks.

Due to characteristics of process chambers typically used for plasma etching, or by the use of a ring-shaped ceramic frame, the separation grooves 150 do not reach the lateral surface 103 as it would be the case for sawing process. Typically, the etch process is well defined in regions of the semiconductor substrate 100 outside of and enclosed by the circumferential edge exclusion strap 455, whereas within the edge exclusion strap 455 the etch process may be ill-defined or more or less without effect.

An indentation 158 is formed along the lateral surface 103, e.g., by a mechanical round-cut or by a grinding process centered to the center axis of the semiconductor substrate 100. According to other embodiments, the indentation 158 may be formed by an etch process, e.g. a dedicated etch process using an etch mask covering completely the inner part of the semiconductor substrate 100.

Figure 3A:
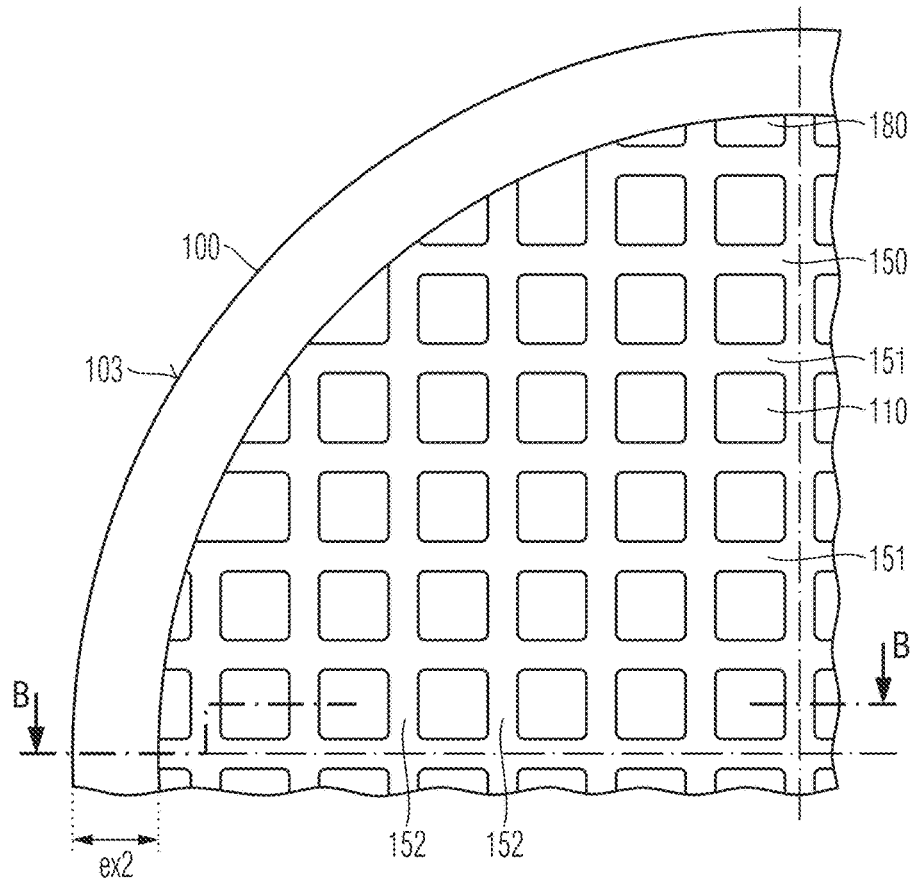
FIG. 3A is a schematic top view of the semiconductor substrate portion of FIG. 2A, after forming, along a lateral surface, a circular indentation opening the separation grooves at the end faces.
Figure 3B:
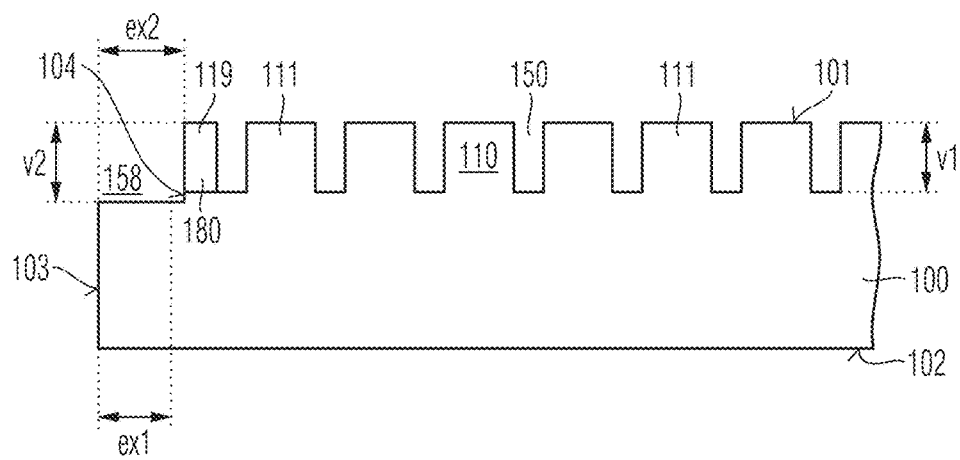
FIG. 3B is a schematic vertical cross-sectional view of the semiconductor substrate portion of FIG. 3A along line B-B.

FIGS. 3A and 3B show the indentation 158 with a vertical extension v2 which is equal to or greater than the vertical extension v1 of the separation grooves 150. The indentation 158 may have uniform width along the whole circumference of the semiconductor substrate 100 including a possible lateral flat. A minimum width ex2 of the indentation 158 is equal to or greater than the first distance ex1.

The indentation 158 opens the separation grooves 150 at their end faces such that the separation grooves 150 open out into the indentation 158. The indentation 158 may form steps 104 at the boundary to the separation grooves 150. The first and second separation grooves 151, 152 are open-ended and end in free space.

Between the main surface 101 and the bottom of the separation grooves 150 the semiconductor substrate 100 exclusively includes isolated chip regions 110 and does not include a portion forming a continuous circumferential structure around the plurality of complete chip regions 111. Both the complete chip regions 111 and the incomplete chip regions 119 are isolated from each other.

A stiff carrier member 310, e.g., a grinding tape, is reversibly attached to the main surface 101, for example, by adhesion.

Figure 4:
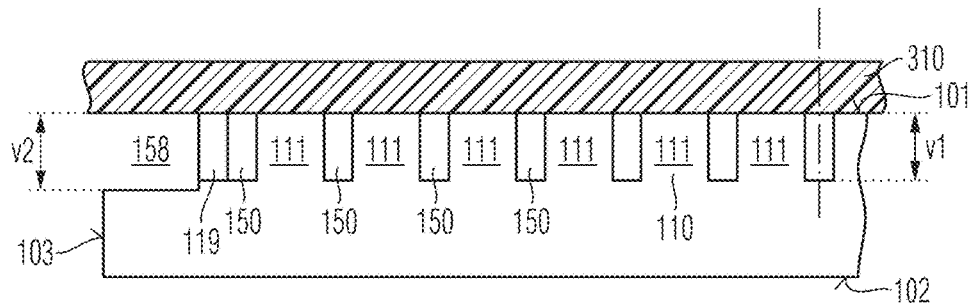
FIG. 4 is a schematic vertical cross-sectional view of a portion of a semiconductor chip assembly including the semiconductor substrate portion of FIG. 3B, after attaching a carrier member on the main surface.

The carrier member 310 shown in FIG. 4 may be a rigid, non-stretching film that is adhered to the main surface 101, for example, a temporary bonding adhesive tape that may include a PET/LCP (polyethylene terephthalate/liquid crystalline polymer) base film and a radiation or thermal release adhesive film for reversibly adhering the base film to the semiconductor substrate 100.

According to the illustrated embodiment, the separation grooves 150 may remain unfilled before applying the carrier member 310 such that the carrier member 310 covers empty separation grooves 150. According to other embodiments, a passivation layer may be formed that lines at least portions of the sidewalls of the chip regions 110 prior to applying the carrier member 310 or a fill process may fill the separation grooves 150 with a sacrificial material, e.g., before forming the indentation 158.

Starting from the undiced surface 102 opposite to the main surface 101, a grinding process removes an undiced section 120 of the semiconductor substrate 100. For example, a grinding wheel grinds the semiconductor substrate 100 from the back. The grinding opens the separation grooves 150 from the back and completes separation of the chip regions 110.

Figure 5:
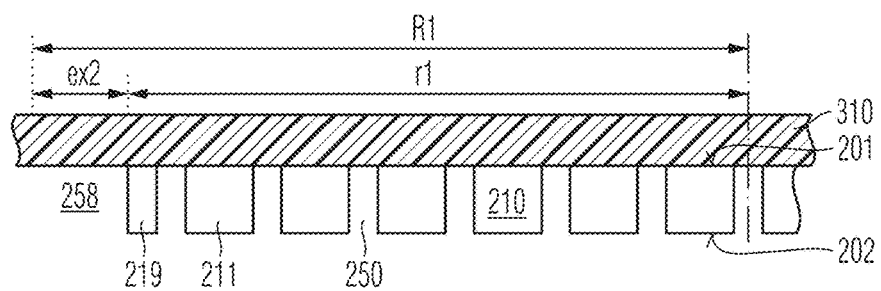
FIG. 5 is a schematic vertical cross-sectional view of the semiconductor chip assembly portion of FIG. 4, after grinding from a side opposite to the main surface.

FIG. 5 shows isolated semiconductor dies 210 formed from the fully separated chip regions 110 of FIG. 4. Separation trenches 250 formed from the vertically opened separation grooves 150 of FIG. 4 separate the semiconductor dies 210. A vertical extension of the separation trenches 250 may be equal to or smaller than the vertical extension of the separation grooves 150 of FIG. 4. In the horizontal directions, the separation trenches 250 end in free space and no remnants of the semiconductor substrate 100 of FIG. 4 are in the longitudinal projection of the separation trenches 250.

The semiconductor dies 210 include complete semiconductor dies 211 formed from complete chip regions 111 of FIG. 4 as well as scrap dies 219 formed from the incomplete chip regions 119 of FIG. 4. A first surface 201 at a front side of the semiconductor dies 210 is attached to the carrier member 310 and a second surface 202 on the back is exposed.

The semiconductor dies 210 are arranged within a circle with a first radius r1 around a center point. The first radius r1 is smaller than a wafer standard radius R1 by the indentation width ex2, i.e., r1=R1−ex2. R1 may be, e.g., 150 mm, 100 mm, 75 mm, or 50 mm. The horizontal indentation width ex2 is in a range from 1.5 mm to 4 mm, e.g., about 3.1 mm A stretchable pick-up tape 320 is attached to the exposed second surface 202 of the semiconductor dies 210 and the carrier member 310 is removed from the first surface 201 of the semiconductor dies 210.

Figure 6:
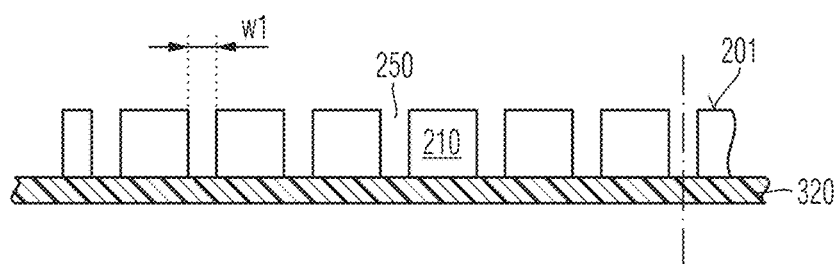
FIG. 6 is a schematic vertical cross-sectional view of the semiconductor chip assembly portion of FIG. 5, after attaching a pick-up tape on the side opposite to the main surface.

FIG. 6 shows singulated semiconductor dies 210 separated by separation trenches 250, arranged matrix-like in lines and rows and with the second surfaces 202 attached on the pick-up tape 320. The pick-up tape 320 is expendable and can be put into an expansion frame.

Figure 7:
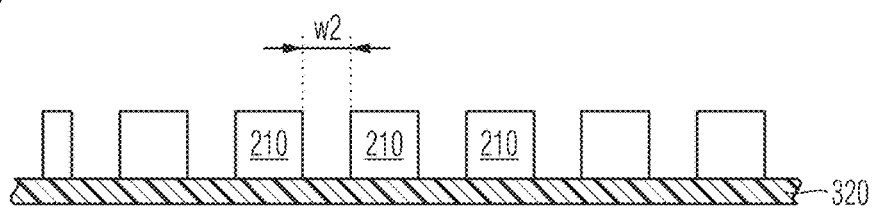
FIG. 7 is a schematic vertical cross-sectional view of the semiconductor chip assembly portion of FIG. 6, after stretching the pick-up tape.

As shown in FIG. 7 the pick-up tape 320 may be horizontally stretched along the longitudinal axis of first separation trenches or into two orthogonal horizontal directions along the longitudinal axes of first separation trenches and of second separation trenches orthogonal to the first separation trenches, wherein the separation trenches 250 expand from the first width w1 to a second width w2 greater than the first width w1 such that conventional handling equipment can pick up the semiconductor dies 210 from the pick-up tape 320 for packaging or placement.

Compared to conventional DBG schemes using mechanical half-cut sawing from the front side, forming the separation grooves 150 by a chemical-physical etching process allows for narrower separation grooves 150 such that yield per wafer may be increased by several percent. Equipment constraints typically exclude etching along the lateral surface of a semiconductor substrate, restrict the etchable area to a central portion of a semiconductor substrate, and exclude well-defined etching in a ring-shaped edge exclusion area along the lateral surface. As a consequence, other than mechanical sawing streets, the etched separation grooves 150 do not cross the complete wafer and end within the semiconductor substrate 100 in a distance to the lateral surface 103. A remnant portion of the semiconductor substrate may form closed substrate ring that surrounds the separated semiconductor dies 210 when the singulated semiconductor dies 210 are attached to a stretchable pick-up tape 320. The closed substrate ring is not stretchable and therefore has to be removed from either the carrier member 310 before attaching the pick-up tape 320 or from the pick-up tape 320 before stretching the pick-up tape 320 for picking up the semiconductor dies 210. Removing the substrate ring, however, involves an additional, dedicated process that may inadvertently remove also functional semiconductor dies which get lost. Removal of the substrate ring generates extra costs and reduces the total yield.

According to the embodiments, the indentation 158 overlaps with some or all of the first and second separation grooves 151, 152 such that at least some of the separation grooves 150, e.g., at least 50% of the separation grooves 150 and, as a consequence, the separation trenches 250 are open-ended and end in free space. No closed substrate ring surrounds the plurality of semiconductor dies 210 in the horizontal plane. The pick-up tape 320 with the singulated semiconductor dies 210 can be expanded without any additional step for selectively removing a substrate ring.

Figure 8A:
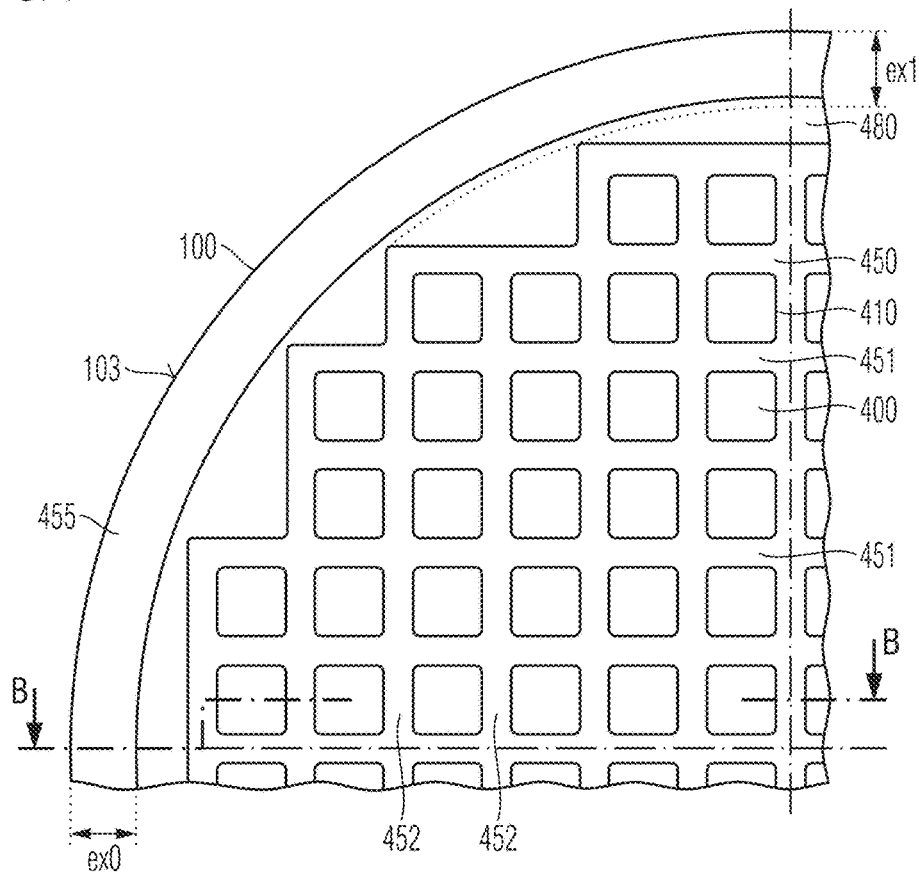
FIG. 8A is a schematic top view of a portion of a semiconductor substrate for illustrating a comparative method for die singulation for illustrating effects of the embodiments, after forming an etch mask.

FIGS. 8A to 9B refer to a comparative example with terminated separation grooves. FIGS. 8A and 8B show an etch mask 400 with mask trenches 451, 452 separating isolated mask portions 410 from each other and from a boundary mask portion 480 that forms a closed, circumferential mask structure around the mask portions 410. The mask trenches 451, 452 do not include stubs extending into the boundary mask portion 480 and an inner edge of the boundary mask portion 480 includes only orthogonal line portions opposite to mask portions 410.

Figure 8B:
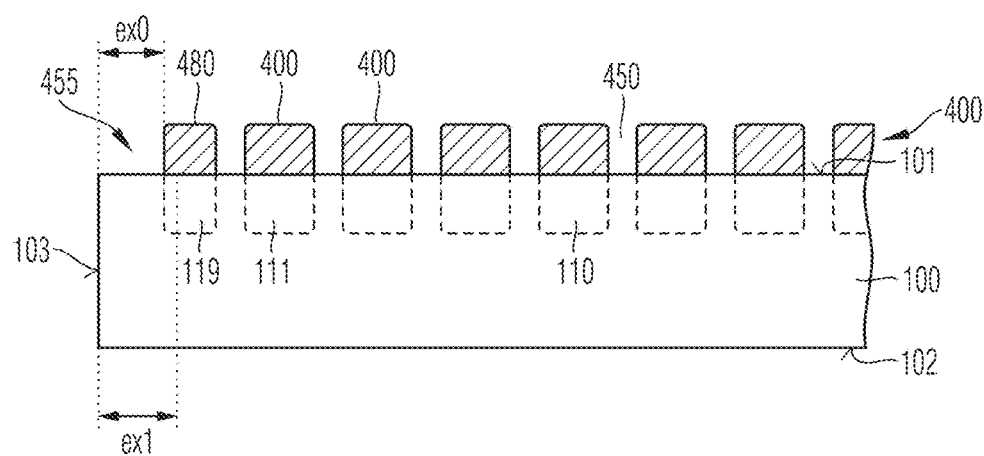
FIG. 8B is a schematic vertical cross-sectional view of the semiconductor substrate portion of FIG. 8A along line B-B.
Figure 9A:
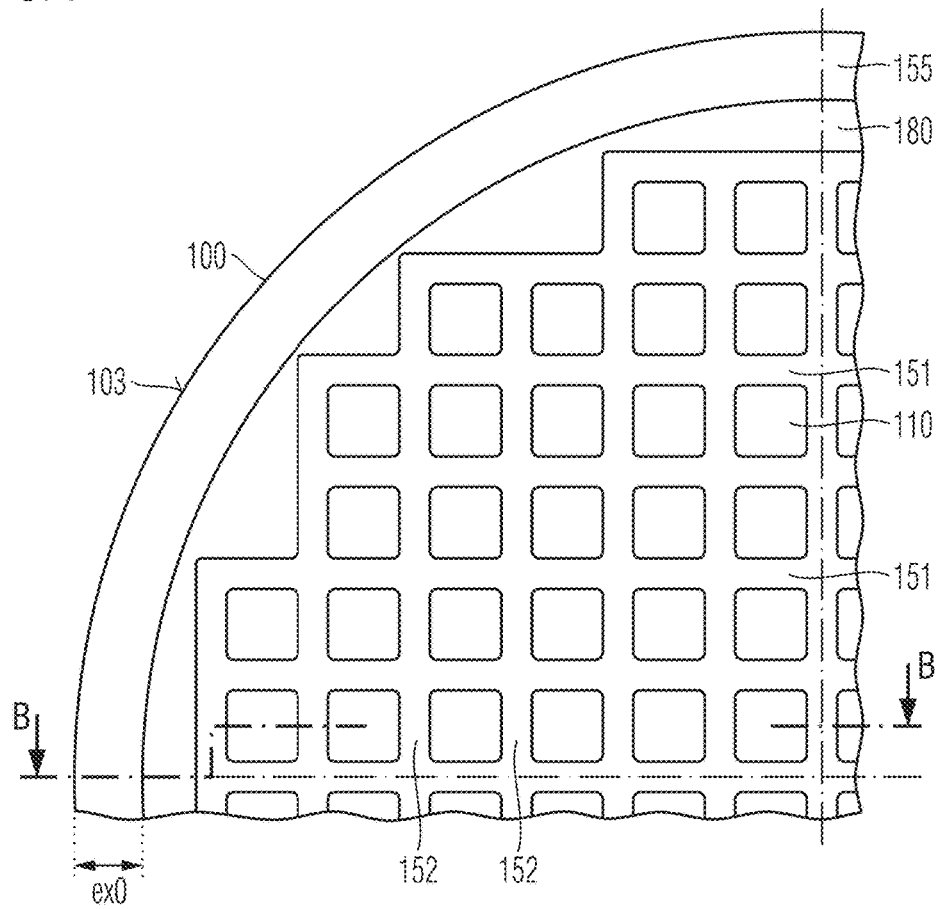
FIG. 9A is a schematic top view of the semiconductor substrate portion of FIG. 8A, after forming terminated separation grooves.
Figure 9B:
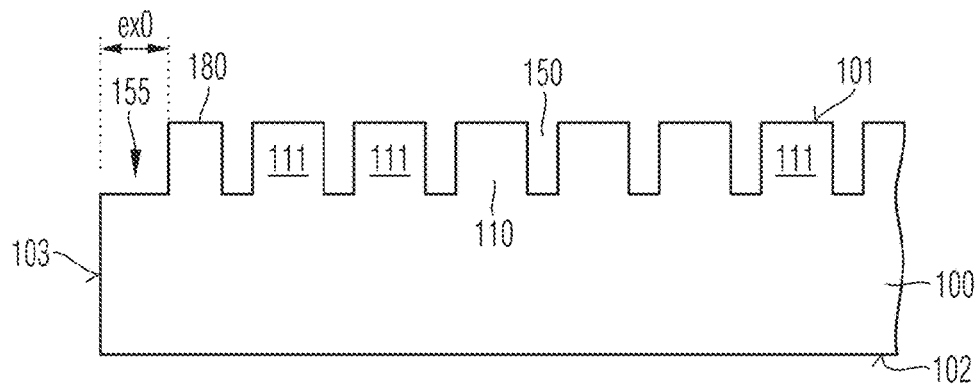
FIG. 9B is a schematic vertical cross-sectional view of the semiconductor substrate portion of FIG. 9A along line B-B.

FIGS. 9A and 9B show the semiconductor substrate 100 after forming separation grooves 150 in a vertical projection of the mask trenches 450 of FIGS. 8A and 8B. Even if the semiconductor substrate 100 is recessed in the area of the edge exclusion strap 455 such that an edge groove 155 extends along the edge of the main surface 101, a continuous substrate ring 180 is formed in the vertical projection of the boundary mask portion 480. The substrate ring between the edge groove 155 and the separation grooves 150 terminates the separation grooves 150. The substrate ring 180 has to be removed before semiconductor dies obtained from the chip regions 110 can be picked up from a stretched pick-up tape.

FIGS. 10A to 12B refer to an embodiment where the semiconductor substrate 100 is not etched in the edge exclusion strap 455.

Figure 10A:
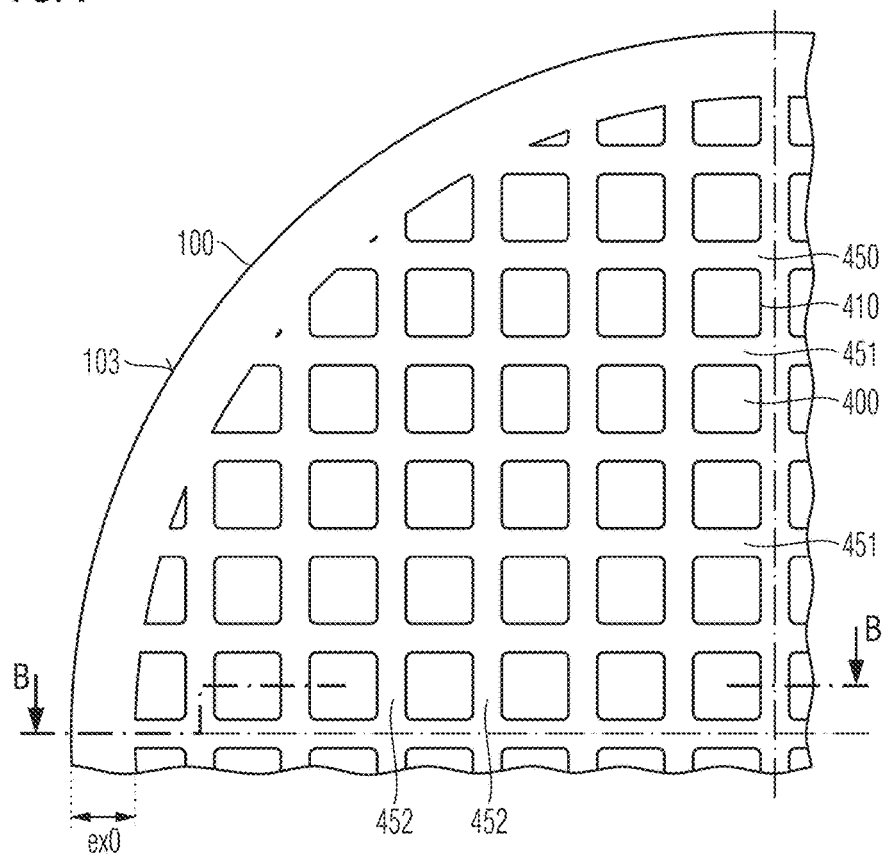
FIG. 10A is a schematic top view of a portion of a semiconductor substrate for illustrating a method for separating semiconductor dies from the semiconductor substrate by a "dice before grind" process according to an embodiment concerning open-ended mask grooves and initially terminated separation grooves, after forming an etch mask.
Figure 10B:
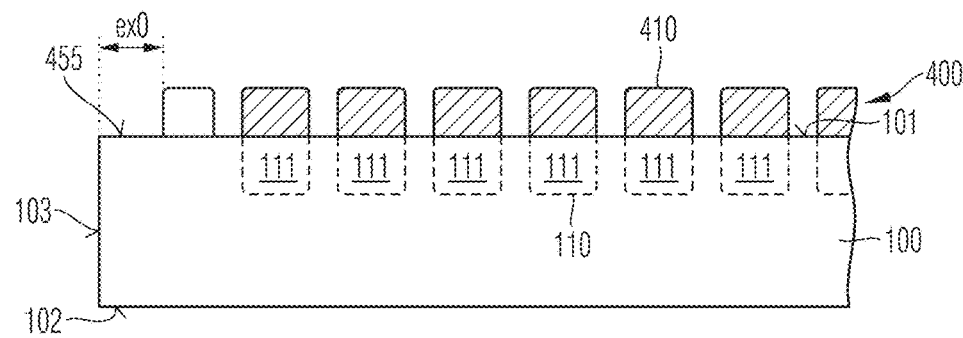
FIG. 10B is a schematic vertical cross-sectional view of the semiconductor substrate portion of FIG. 10A along line B-B.

As shown in FIGS. 10A to 10B, the mask trenches 450 are open-ended, extend through the complete mask layer and open out into the edge exclusion strap 455. An etch process recesses portions of the semiconductor substrate 100 exposed by the mask trenches 450 but is not effective in at least a portion of the edge exclusion strap 455.

Figure 11A:
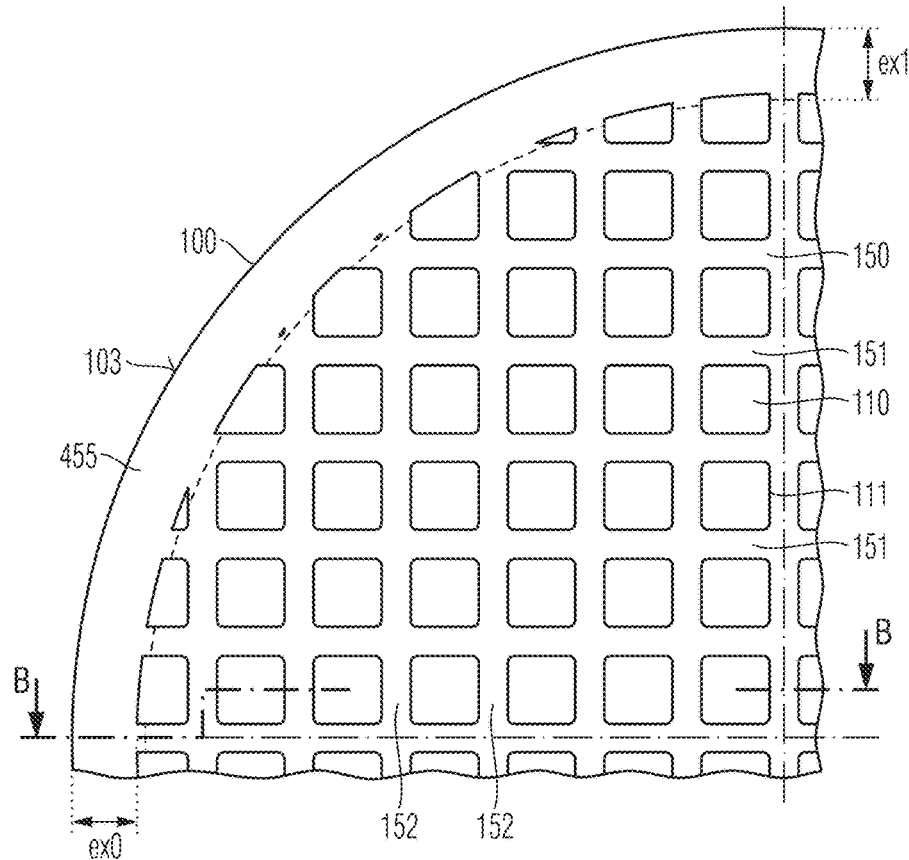
FIG. 11A is a schematic top view of the semiconductor substrate portion of FIG. 10A, after forming separation grooves.
Figure 11B:
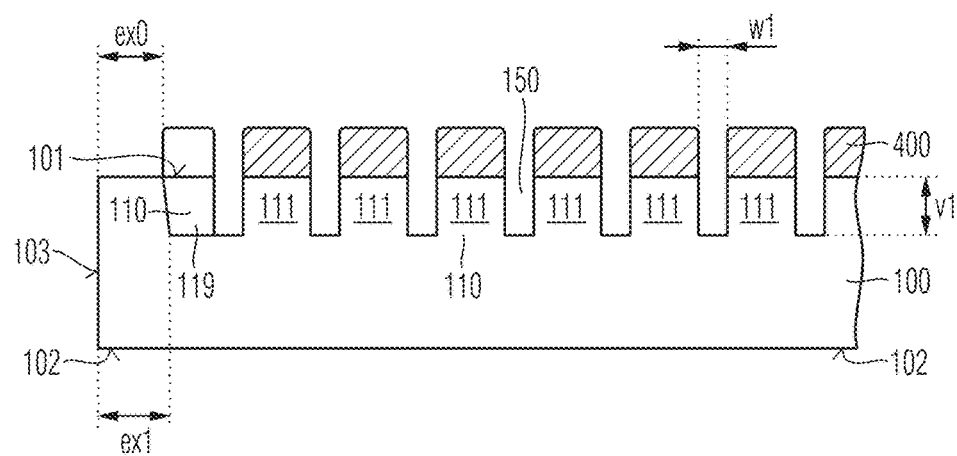
FIG. 11B is a schematic vertical cross-sectional view of the semiconductor substrate portion of FIG. 11A along line B-B.

As shown in FIGS. 11A to 11B, the separation grooves 150 formed in the semiconductor substrate 100 are horizontally terminated at the end faces by an unrecessed substrate ring 180 in a region within the edge exclusion strap 455, e.g., along the lateral surface 103. For example, a ring-shaped ceramic frame is placed between the semiconductor substrate 100 and an ion beam source when the separation grooves 150 are formed, wherein a diameter of the opening of the ring-shaped ceramic frame is smaller than the diameter of the semiconductor substrate 100.

An indentation 158 with a minimum indentation width ex2 that is equal to or greater than the width ex0 of the edge exclusion strap 455 or equal to or greater than the diameter of the opening of the ring-shaped ceramic frame is formed along the edge of the main surface 101.

Figure 12A:
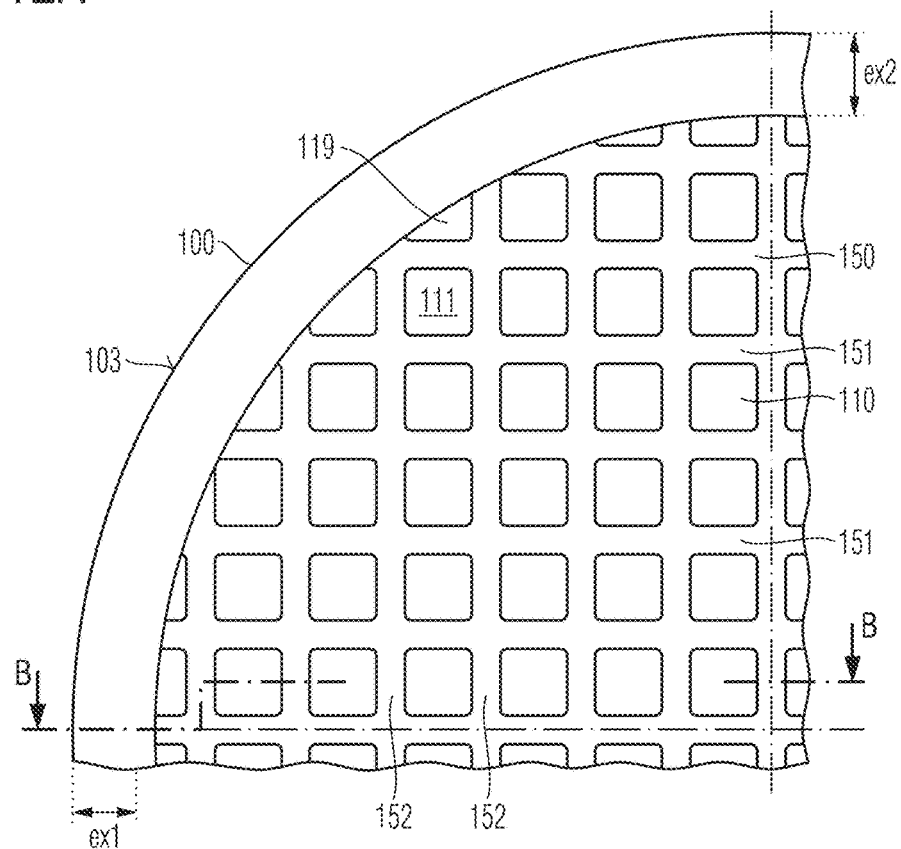
FIG. 12A is a schematic top view of the semiconductor substrate portion of FIG. 1A, after forming, along a lateral surface, a circular indentation horizontally opening the separation grooves at the end faces.
Figure 12B:
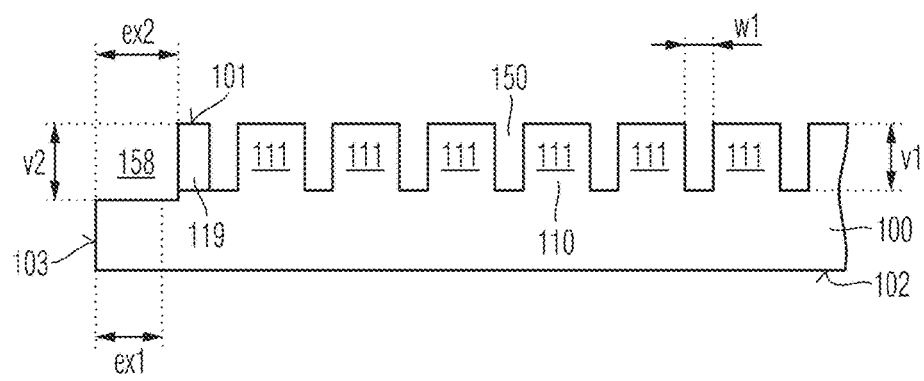
FIG. 12B is a schematic vertical cross-sectional view of the semiconductor substrate portion of FIG. 12A along line B-B.

FIGS. 12A and 12B show that forming the indentation 158 completely removes the unrecessed substrate ring 180.

Figure 13A:
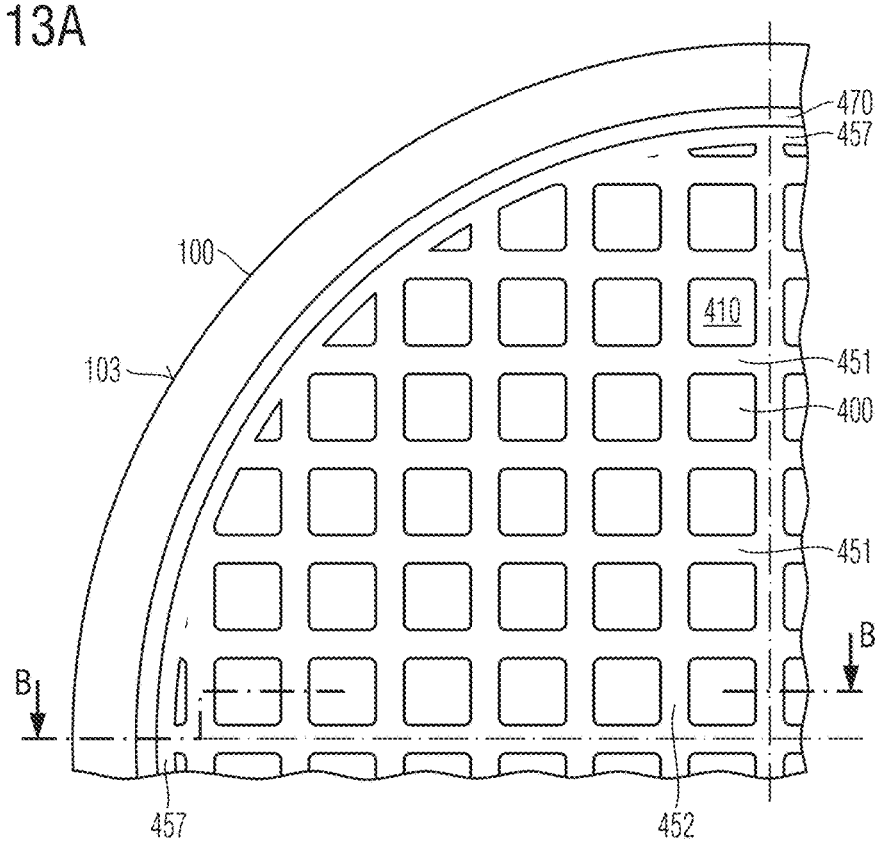
FIG. 13A is a schematic top view of a portion of a semiconductor substrate for illustrating a method for separating semiconductor dies from the semiconductor substrate by a "dice before grind" process according to another embodiment concerning ab-initio open-ended separation grooves opening out in a circumferential groove, after forming an etch mask.
Figure 13B:
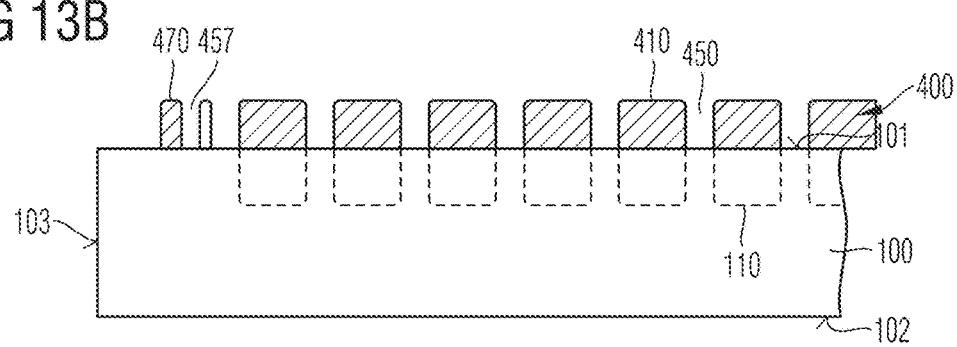
FIG. 13B is a schematic vertical cross-sectional view of the semiconductor substrate portion of FIG. 13A along line B-B.

FIGS. 13A to 13B show a circumferential mask trench 457 connecting the first and second mask trenches 451, 452, wherein a circumferential mask ring 470 separates the circumferential mask trench 457 from the edge exclusion strap 455.

Figure 13C:
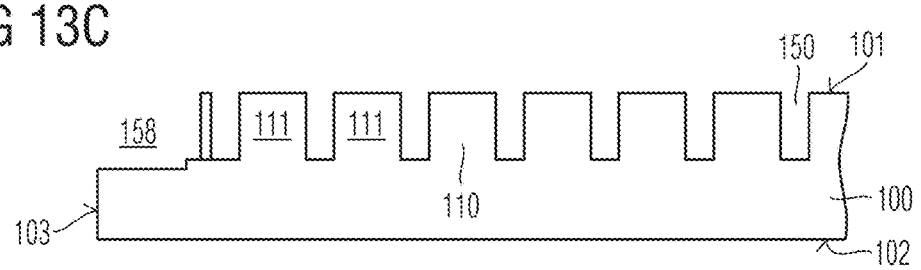
FIG. 13C is a schematic vertical cross-sectional view of the semiconductor substrate portion of FIG. 13B along line B-B of FIG. 13A, after forming separation grooves and an indentation.

FIG. 13C shows that an indentation 158 removes an unrecessed substrate ring that may be formed in the vertical projection of the mask ring 470 of FIGS. 13A and 13B or, in case the semiconductor substrate 100 is not recessed in the edge exclusion strap 455, in the vertical projection of both the mask ring 470 and the edge exclusion strap 455.

Figure 14A:
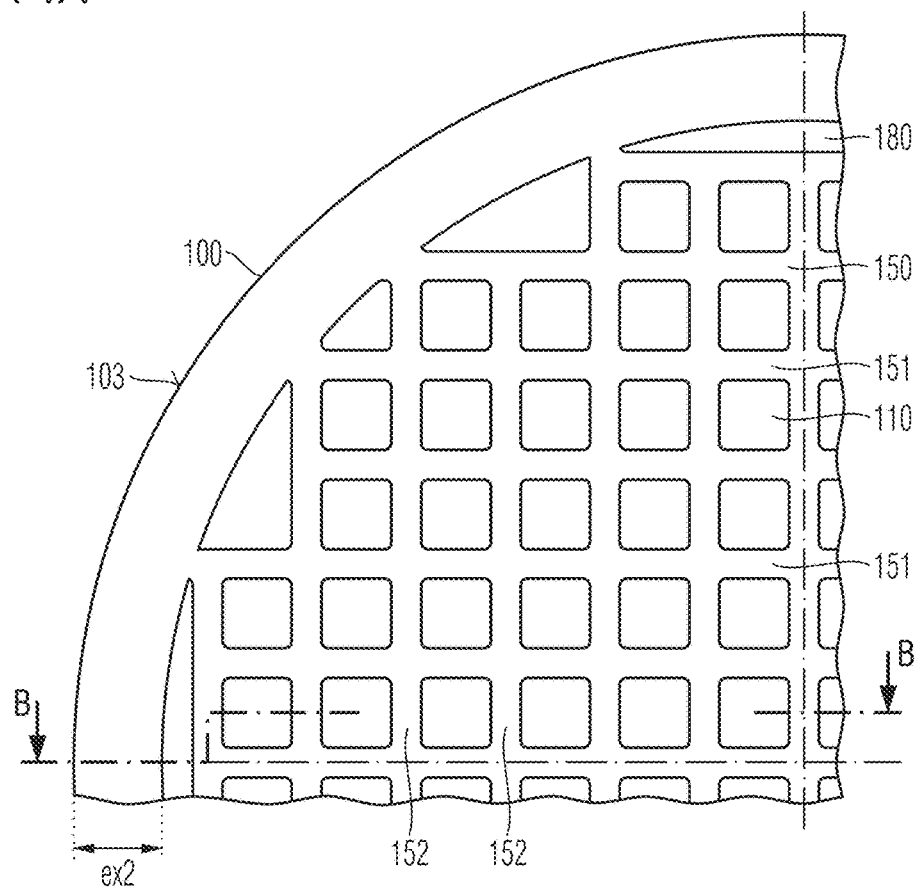
FIG. 14A is a schematic top view of a portion of a semiconductor substrate for illustrating a method for separating semiconductor dies from the semiconductor substrate by a "dice before grind" process according to another embodiment concerning terminated mask grooves and initially terminated separation grooves without stubs, after forming an indentation.
Figure 14B:
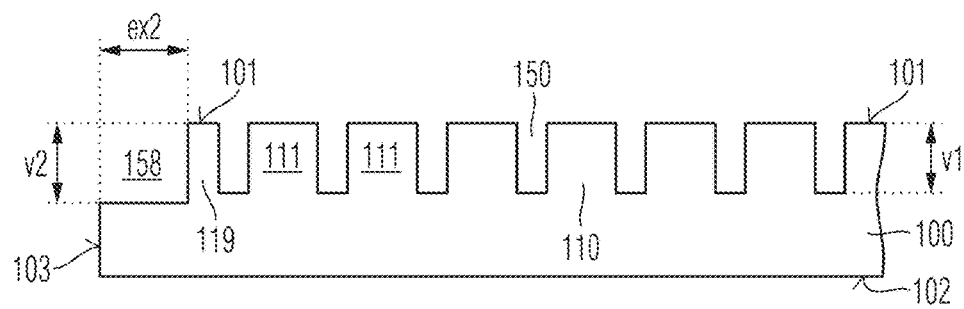
FIG. 14B is a schematic vertical cross-sectional view of the semiconductor substrate portion of FIG. 14A along line B-B.

FIGS. 14A and 14B refer to an embodiment applying an indentation 158 on a semiconductor substrate 100 patterned as illustrated in FIGS. 8A to 9B. The indentation 158 opens at least some of the separation grooves 150. Instead of a continuous substrate ring, a plurality of separated scrap portions 180x including the incomplete chip regions 119 is formed. The separated scrap portions 180x are arranged along a line surrounding a matrix of complete chip regions 111 such that a pick-up tape attached to semiconductor dies obtained from the chip regions 111 and to the separated scrap portions 180x can be sufficiently expanded into orthogonal horizontal directions.

Figure 15A:
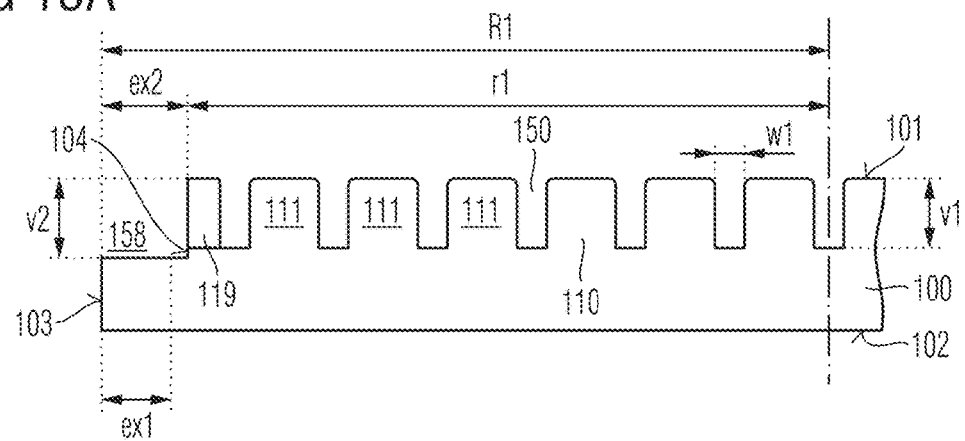
FIG. 15A is a schematic vertical cross-sectional view of a portion of a semiconductor substrate including separation grooves and a circular indentation according to an embodiment without carrier tape.

FIG. 15A shows a semiconductor substrate assembly 501 with a semiconductor substrate 100 with separation grooves 150 extending from a main surface 101 into the semiconductor substrate 100. A horizontal width w1 of the separation grooves 150 may be in a range from 6 μm to 20 μm. A vertical extension v1 of the separation grooves 150 is in a range from 10 μm to 300 μm, e.g. up to 250 μm. The separation grooves 150 include equally-spaced, parallel first separation grooves 151 and equally-spaced, parallel second separation grooves 152 orthogonal to the first separation grooves 151 and intersecting the first separation grooves as illustrated in FIG. 3A. The separation grooves 150 horizontally separate chip regions 110 in the semiconductor substrate 100. Along an edge of the main surface 101 with the lateral surface 103 an indentation 158 extends from the main surface 101 into the semiconductor substrate 100. A vertical extension v2 of the indentation 158 is equal to or greater than a vertical extension v1 of the separation grooves 150. The indentation 158 may have a uniform indentation width ex2 of at least 3 mm.

Each chip region 110 is formed along or close to the main surface 101 and includes a plurality of interconnected passive and active electronic components. The chip regions 110 may include a metallization layer at the front side along the main surface 101. The chip regions 110 may correspond to the dies of microcontrollers for chip cards, e.g., mobile phone SIM cards, payment cards, or security chips.

The chip regions 110 are arranged within a circle with a first radius r1 around a center axis of the semiconductor substrate 100. The first radius r1 is smaller than a wafer standard radius R1 by the indentation width ex2, i.e., r1=R1−ex2. R1 may be, e.g., 150 mm, 100 mm, 75 mm, or 50 mm. The indentation width ex2 is in a range from 1.5 mm to 4 mm, e.g., about 3.1 mm.

Figure 15B:
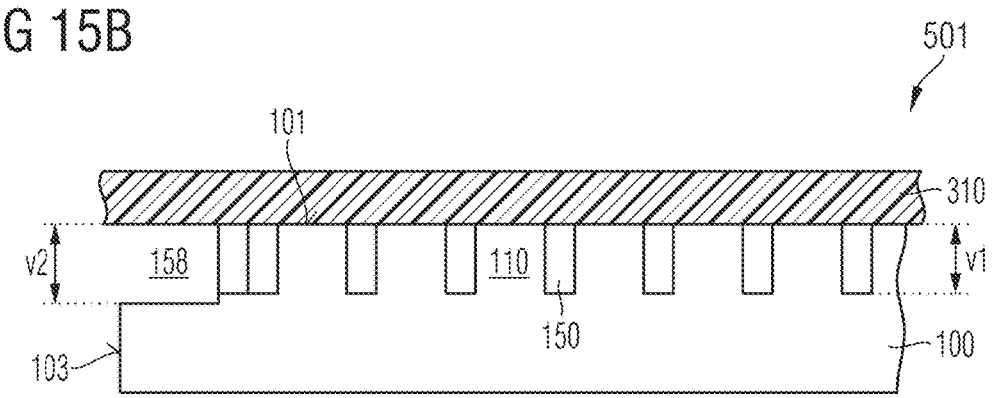
FIG. 15B is a schematic vertical cross-sectional view of a portion of a semiconductor substrate including separation grooves and a circular indentation according to an embodiment with a carrier tape.

In FIG. 15B a semiconductor substrate assembly 501 includes a stiff carrier member 310 attached onto a main surface 101 at the front side of a semiconductor substrate 100 as described with reference to FIG. 15A. The carrier member 310 may be a rigid, non-stretching film. According to an embodiment the carrier member is a temporary bonding adhesive tape that may include a PET/LCP (polyethylene terephthalate/liquid crystalline polymer) base film and a radiation or thermal release adhesive film for reversibly adhering the base film to the semiconductor substrate 100.

Figure 16A:
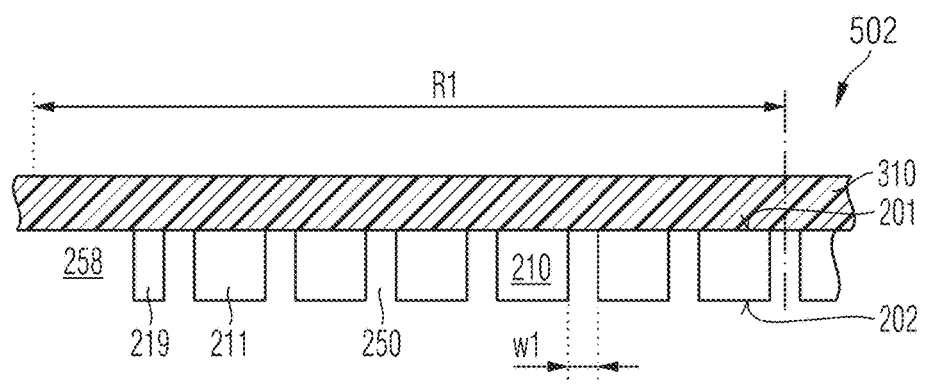
FIG. 16A is a schematic cross-sectional view of a portion of a semiconductor chip assembly according to an embodiment wherein a plurality of semiconductor chips is attached on a carrier member.

FIG. 16A refers to a semiconductor die assembly 502 including a plurality of semiconductor dies 210 attached matrix-like in lines and rows and equally spaced from another on a carrier member 310.

The semiconductor dies 210 may include a metallization layer along first surfaces 201 adhered to the carrier member 310. The semiconductor dies 210 may by dies for microcontrollers for chip cards, e.g., mobile phone SIM cards, payment cards, or security chips.

The semiconductor dies 210 are arranged within a circle with a first radius r1 around a center axis of the arrangement of semiconductor dies 210. The first radius r1 is smaller than a wafer standard radius R1 by the indentation width ex2, i.e., r1=R1−ex2. R1 may be, e.g., 150 mm, 100 mm, 75 mm, or 50 mm. The indentation width ex2 is in a range from 1.5 mm to 5 mm, e.g., about 3.1 mm.

Figure 16B:
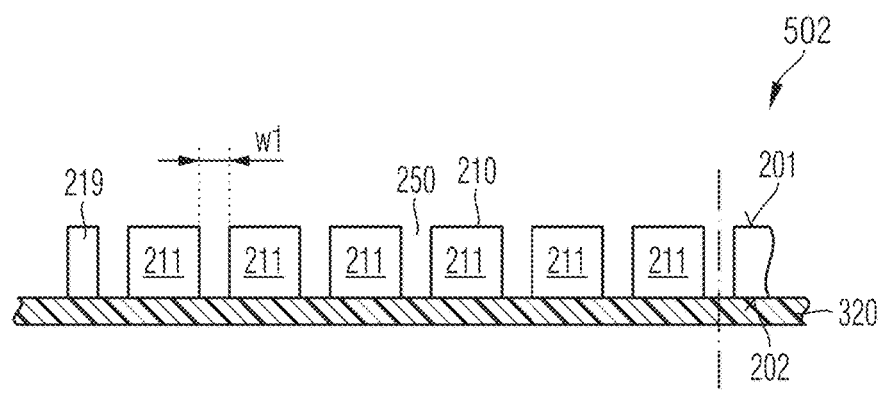
FIG. 16B is a schematic cross-sectional view of a portion of a semiconductor chip assembly according to an embodiment wherein a plurality of semiconductor chips is attached on a pick-up tape.

In FIG. 16B a flexible pick-up tape 320 attached onto second surfaces 202 on the back of the semiconductor dies 210 through a radiation or thermal release adhesive film substitutes the carrier member 310 of FIG. 16B. The pick-up tape 320 may include a substrate film from, e.g., PVC (Polyvinyl Chloride) or polyeolefin and an adhesion film from, e.g., rubber or UV-sensitive acrylic. A further embodiment combines the semiconductor substrate 100 with both the pick-up tape of FIG. 16B and the carrier member 310 of FIG. 16A.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die assembly, comprising
   a plurality of semiconductor dies separated in two orthogonal horizontal directions by equally-spaced separation trenches, respectively, wherein the semiconductor dies are arranged within a circle with a first radius around a center axis of the semiconductor die assembly and the first radius is smaller than a wafer standard radius by an indentation width of at least 1 mm and at most 5 mm;
   a stiff carrier member adhered onto first surfaces at a front side of the semiconductor dies through a radiation or thermal release adhesive film; and
   a flexible pick-up tape adhered onto second surfaces on a back side of the semiconductor dies through a radiation or thermal release adhesive film.

2. The semiconductor die assembly of claim 1, wherein a horizontal width of the separation trenches is in a range from 6 µm to 20 µm.

3. The semiconductor die assembly of claim 1, wherein the semiconductor dies are dies of microcontrollers for chip cards.

4. The semiconductor die assembly of claim 1, wherein the flexible pick-up tape comprises a substrate film and an adhesion film.

5. The semiconductor die assembly of claim 4, wherein the substrate film comprises PVC (Polyvinyl Chloride).

6. The semiconductor die assembly of claim 4, wherein the substrate film comprises polyeolefin.

7. The semiconductor die assembly of claim 4, wherein the adhesion film comprises rubber.

8. The semiconductor die assembly of claim 4, wherein the adhesion film comprises UV-sensitive acrylic.

9. A semiconductor die assembly, comprising:
   a plurality of semiconductor dies separated in two orthogonal horizontal directions by equally-spaced separation trenches, respectively, wherein the semiconductor dies are arranged within a circle with a first radius around a center axis of the semiconductor die assembly and the first radius is smaller than a wafer standard radius by an indentation width;
   a stiff carrier member adhered onto first surfaces at a front side of the semiconductor dies through a radiation or thermal release adhesive film; and
   a flexible pick-up tape adhered onto second surfaces on a back side of the semiconductor dies through a radiation or thermal release adhesive film.

10. The semiconductor die assembly of claim 9, wherein a horizontal width of the separation trenches is in a range from 6 µm to 20 µm.

11. The semiconductor die assembly of claim 9, wherein the semiconductor dies are dies of microcontrollers for chip cards.

12. The semiconductor die assembly of claim 9, wherein the flexible pick-up tape comprises a substrate film and an adhesion film.

13. The semiconductor die assembly of claim 12, wherein the substrate film comprises PVC (Polyvinyl Chloride).

14. The semiconductor die assembly of claim 12, wherein the substrate film comprises polyeolefin.

15. The semiconductor die assembly of claim 12, wherein the adhesion film comprises rubber.

16. The semiconductor die assembly of claim 12, wherein the adhesion film comprises UV-sensitive acrylic.

17. The semiconductor die assembly of claim 9, wherein the indentation width is at least 1 mm.

18. The semiconductor die assembly of claim 9, wherein the indentation width is less than 5 mm.

19. A semiconductor die assembly, comprising:
   a plurality of semiconductor dies separated in two orthogonal horizontal directions by equally-spaced separation trenches, respectively, wherein the semiconductor dies are arranged within a circle with a first radius around a center axis of the semiconductor die assembly and the first radius is smaller than a wafer standard radius by an indentation width; and
   a flexible pick-up tape adhered onto a back side of the semiconductor dies through a radiation or thermal release adhesive film,
   wherein the indentation width is equal to or greater than a width of the separation trenches.

20. The semiconductor die assembly of claim 19, wherein the indentation width is greater than 1 mm and less than 5 mm.

* * * * *